United States Patent

Fulford, Jr. et al.

[11] Patent Number: 5,827,761
[45] Date of Patent: Oct. 27, 1998

[54] METHOD OF MAKING NMOS AND DEVICES WITH SEQUENTIALLY FORMED GATES HAVING DIFFERENT GATE LENGTHS

[75] Inventors: H. Jim Fulford, Jr.; Robert Dawson, both of Austin; Mark I. Gardner, Cedar Creek; Frederick N. Hause, Austin; Mark W. Michael, Cedar Park; Bradley T. Moore; Derick J. Wristers, both of Austin, all of Tex.

[73] Assignee: Advanced Micro Devices, Inc., Sunnyvale, Calif.

[21] Appl. No.: 805,537

[22] Filed: Feb. 25, 1997

[51] Int. Cl.$^6$ .................................................. H01L 21/8238

[52] U.S. Cl. ......................... 438/199; 438/229; 438/303; 438/305; 438/306; 438/307

[58] Field of Search .................................. 437/34, 57, 58, 437/86, 186; 438/199, 229, 303, 305, 306, 307, 168, 217, 218, 346

[56] References Cited

PUBLICATIONS

U.S. Patent Application Serial No. 08/623,802, filed Mar. 29, 1996, entitled "Method of Processing a Semiconductor Wafer For Controlling Drive Current", by Fulford, Jr. et al.

*Primary Examiner*—John Niebling
*Assistant Examiner*—Long Pham
*Attorney, Agent, or Firm*—Skjerven, Morrill, MacPherson, Franklin & Friel; David M. Sigmond

[57] ABSTRACT

A method of making NMOS and PMOS devices with different gate lengths includes providing a semiconductor substrate with first and second active regions, forming a first gate over a portion of the first active region and a second gate over a portion of the second active region, wherein the first and second gates are formed in sequence and have different lengths, and forming a source and drain in the first active region and a source and drain in the second active region. Preferably, the first gate is defined by a first photoresist layer patterned with a first exposure time, the second gate is defined by a second photoresist layer patterned with a second exposure time, and the difference in gate lengths is due primarily to a difference between the first and second exposure times.

34 Claims, 4 Drawing Sheets

METHOD OF MAKING NMOS AND DEVICES WITH SEQUENTIALLY FORMED GATES HAVING DIFFERENT GATE LENGTHS

BACKGROUND OF THE INVENTION

1. Field of the Invention

The present invention relates to integrated circuit manufacturing, and more particularly to insulated-gate field-effect transistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, the polysilicon is anisotropically etched to provide a gate which provides a mask during formation of the source and drain by ion implantation, and then the implanted dopant is activated using a high-temperature anneal.

As IGFET dimensions are reduced and the supply voltage remains constant (e.g., 3V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate, and a heavy implant is self-aligned to the gate on which sidewall spacers have been formed. The spacers are typically oxides or nitrides. The purpose of the lighter first dose is to form a lightly doped region of the drain (or LDD) at the edge near the channel. The second heavier dose forms a low resistivity region of the drain, which is subsequently merged with the lightly doped region. Since the heavily doped region is farther away from the channel than a conventional drain structure, the depth of the heavily doped region can be made somewhat greater without adversely affecting the device characteristics.

Complementary metal-oxide semiconductor (CMOS) circuits include N-channel (NMOS) devices and P-channel (PMOS) devices. Conventional processes typically use N-well masks and P-well masks early in the processing sequence to define the NMOS and PMOS regions. Conventional process also typically include a single masking step for forming the gates for the NMOS and PMOS devices, separate masking steps for implanting lightly doped N-type source/drain regions into the NMOS device and lightly doped P-type source/drain regions in the PMOS device, formation of spacers adjacent to the gates of the NMOS and PMOS devices, and then separate masking steps for implanting heavily doped N-type source/drain regions into the NMOS device and heavily doped P-type source/drain regions into the PMOS device.

In CMOS circuits, it may be desirable to form the NMOS and PMOS devices with different gate lengths (or critical dimensions). For instance, if the NMOS and PMOS devices are intended to have similar channel lengths, and the NMOS source/drains are doped with arsenic and the PMOS source/drains are doped with boron, then a shorter NMOS gate length may be desirable since boron diffuses far more rapidly than arsenic during high-temperature processing. Likewise, to obtain a predetermined drive current ratio of the NMOS and PMOS devices, for instance in an inverter circuit, then independently adjusting the gate lengths of the NMOS and PMOS devices can be useful since the drive current is a function of channel length.

It is possible to provide different gate lengths for the NMOS and PMOS devices by employing a single reticle that defines the desired gate lengths, patterning a photoresist layer above the gates using an image pattern from the reticle, and simultaneously etching the gates. Unfortunately, the difference in length between feature sizes on a given reticle is often limited to a given increment, which in turn limits the difference in length between feature sizes of an image pattern generated by projecting radiation through the reticle and a lens onto the photoresist layer. If, for instance, the difference in feature sizes of the image pattern is adjustable in increments of 500angstroms, yet the desired difference in gate lengths is on the order of 50 to 300 angstroms, then the conventional approach does not suffice.

Accordingly, a need exists for an improved method of making a N-channel and P-channel devices with different gate lengths.

SUMMARY OF THE INVENTION

An object of the present invention is to provide N-channel and P-channel devices with different gate lengths.

In accordance with one aspect of the invention, a method of forming N-channel and P-channel devices with different gate lengths includes providing a semiconductor substrate with first and second active regions, forming a first gate over a portion of the first active region and a second gate over a portion of the second active region, wherein the first and second gates are formed in sequence and have different lengths, and forming a source and drain in the first active region and a source and drain in the second active region. Preferably, the first gate is defined by a first photoresist layer and the second gate is defined by a second photoresist layer. In this manner, the difference in length between the first and second gates is not limited by the patterning capability of a single photoresist layer.

Forming the first and second gates may include forming a polysilicon layer over the first and second active regions, selectively removing a first portion of the polysilicon layer over the first active region through openings in the first photoresist layer to form the first gate, and selectively removing a second portion of the polysilicon layer over the second active region through openings in the second photoresist layer to form the second gate.

Forming the sources and drains may include implanting lightly doped source/drain regions into the first active region through the openings in the first photoresist layer, implanting lightly doped source/drain regions into the second active region through the openings in the second photoresist layer, forming first and second spacers adjacent to the first and second gates, implanting heavily doped source/drain regions into the first active region through an opening in a third photoresist layer using the first gate and first spacers an implant mask, and implanting heavily doped source/drain regions into the second active region through an opening in a fourth photoresist layer using the second gate and second spacers as an implant mask.

The difference in gate lengths can be achieved by irradiating the first and second photoresist layers with different radiation intensities, different exposure times, or different image patterns. Alternatively, the difference in gate lengths can be achieved by applying different etches to the first and second gates.

Preferably, the difference in lengths between the first and second gates is in the range of 20 to 500 angstroms, and more preferably in the range of 20 to 50 angstroms. Advantageously, the difference in gate lengths can be used to adjust a drive current ratio between a first transistor in the first active region and a second transistor in the second active region.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
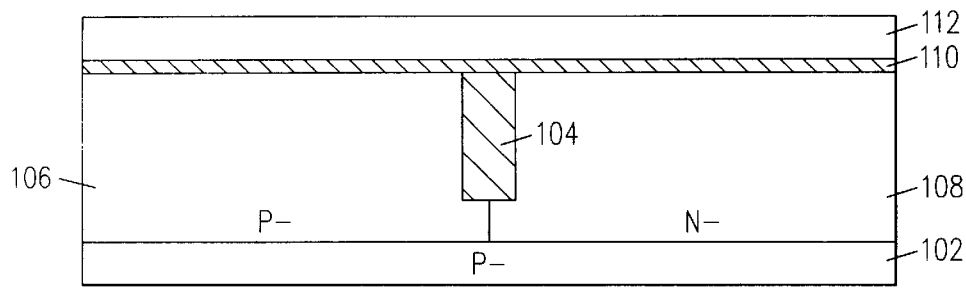
FIGS. 1A–1K show cross-sectional views of successive process steps for making N-channel and P-channel devices with different gate lengths in accordance with an embodiment of the invention.

In the drawings, depicted elements are not necessarily drawn to scale and like or similar elements may be designated by the same reference numeral throughout the several views.

FIGS. 1A–1K show cross-sectional views of successive process steps for making N-channel and P-channel devices with different gate lengths in accordance with an embodiment of the invention. In FIG. 1A, silicon substrate 102 suitable for integrated circuit manufacture is provided. Substrate 102 includes a P– type epitaxial surface layer with a planar top surface disposed on a P+ base layer (not shown). Substrate 102 contains trench oxide 104 that provides dielectric isolation between P– type NMOS region 106 and N– type PMOS region 108 in the epitaxial surface layer. NMOS region 106 has a boron background concentration on the order of $1 \times 10^{15}$ atoms/cm$^3$, a <100> orientation and a resistivity of 12 ohm-cm, and PMOS region 108 has an arsenic background concentration on the order of $1 \times 10^{15}$ atoms/cm$^3$, a <100> orientation and a resistivity of 12 ohm-cm. A blanket layer of gate oxide 110, composed of silicon dioxide, is formed on the top surface of substrate 102 using tube growth at a temperature of 700° to 1000° C. in an $O_2$ containing ambient. Gate oxide 110 has a thickness in the range of 30 to 100 angstroms. Thereafter, a blanket layer of undoped polysilicon 112 is deposited by low pressure chemical vapor deposition (LPCVD) on the top surface of gate oxide 110. Polysilicon 112 has a thickness of 2000 angstroms. If desired, polysilicon 112 can be doped in situ as deposition occurs, or doped before a subsequent etch step by implanting arsenic with a dosage in the range of $1 \times 10^{15}$ to $5 \times 10^{15}$ atoms/cm$^2$ an energy in the range of 2 to 80 kiloelectron-volts. However, it is generally preferred that polysilicon 112 be doped during later processing steps.

Figure 1B:
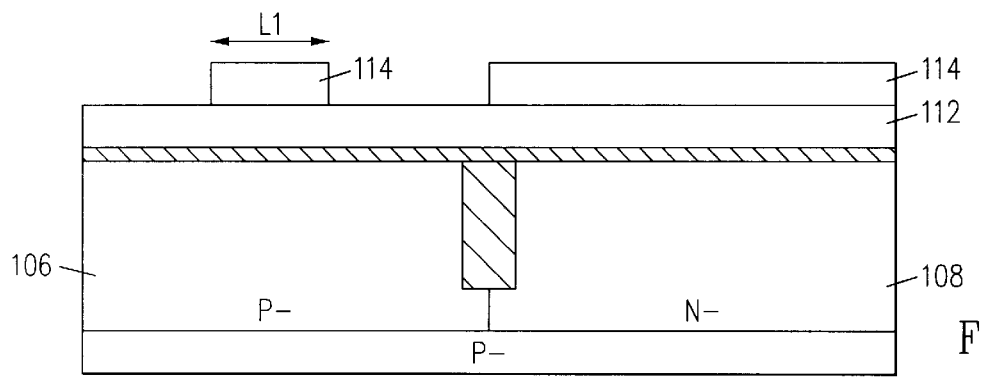

In FIG. 1B, photoresist 114 which is positive-acting is deposited on polysilicon 112 and patterned to provide openings that selectively expose a first portion of polysilicon 112 over NMOS region 106 while photoresist 114 covers the entire PMOS region 108. Photoresist 114 is patterned using a photolithographic system, such as a step and repeat optical projection system, in which deep ultraviolet light from a mercury-vapor lamp is projected through a first reticle and a focusing lens to obtain a first image pattern that defines a first unirradiated gap (where the light is blocked) over NMOS region 106. Thereafter, photoresist 114 is developed and the portions rendered soluble by the first image pattern are removed. Photoresist 114 above NMOS region 106 has a predetermined linewidth or length L1 of 3500 angstroms.

Figure 1C:
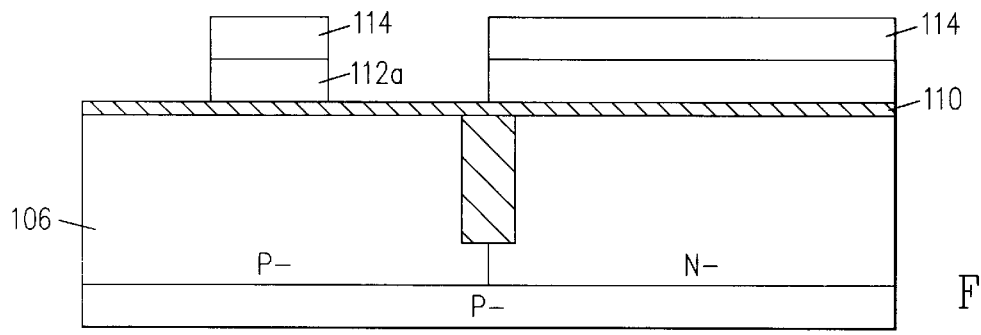
Figure 1D:
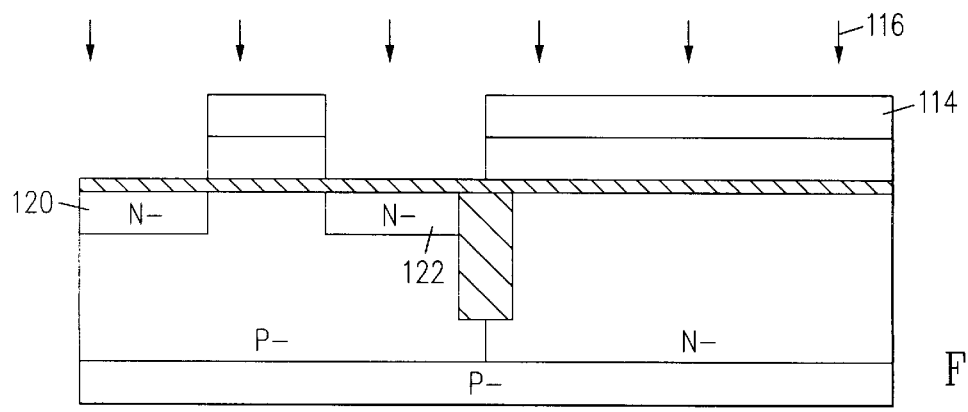

In FIG. 1C, an anisotropic dry etch is applied that removes the regions of polysilicon 112 exposed by the openings in photoresist 114. The dry etch is highly selective of polysilicon 112 and non-selective of gate oxide 110 so that only a negligible amount of gate oxide 110 is removed and substrate 102 is unaffected. After etching occurs, first gate 112a over NMOS region 106 has a length of 3500 angstroms, corresponding to length L1. In FIG. 1D, lightly doped source and drain regions are implanted into NMOS region 106 by subjecting the structure to ion implantation of arsenic, indicated by arrows 116, at a dose in the range of $1 \times 10^{13}$ to $5 \times 10^{14}$ atoms/cm$^2$ and an energy in the range of 2 to 80 kiloelectron-volts. Photoresist 114 provides an implant mask that allows passage of arsenic through the openings therein. As a result, lightly doped source/drain regions 120 and 122 are implanted in NMOS region 106 and are self-aligned to the edges of first gate 112a. Lightly doped source/drain regions 120 and 122 are doped N× with an arsenic concentration in the range of about $1 \times 10_{17}$ to $1 \times 10^{18}$ atoms/cm$^3$ and a junction depth in the range of 100 to 1500 angstroms.

Figure 1E:
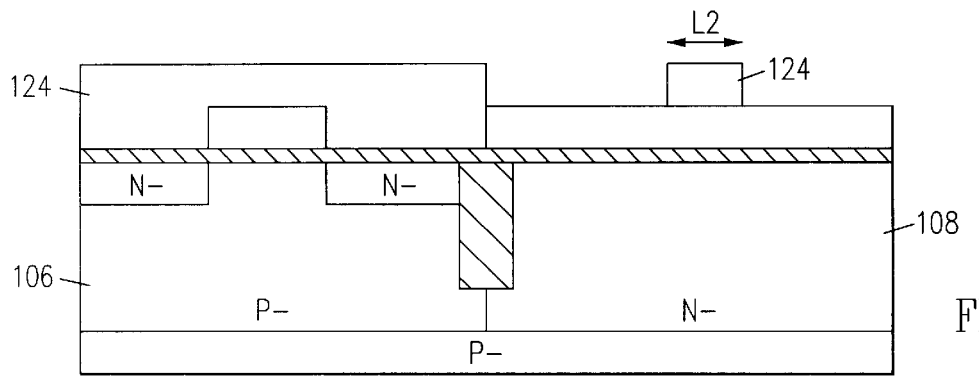

In FIG. 1E, photoresist 114 is stripped, and photoresist 124 which is positive-acting is deposited on polysilicon 112 and patterned to provide openings that selectively expose a second portion of polysilicon 112 over PMOS region 108 while photoresist 124 covers the entire NMOS region 106. Photoresist 124 is patterned using the photolithographic system with a second reticle to obtain a second image pattern that defines a second unirradiated gap (where the light is blocked) over PMOS region 108. Thereafter, photoresist 124 is developed and the portions rendered soluble by the second image pattern are removed. Photoresist 124 above PMOS region 108 has a predetermined linewidth or length L2 of 3450 angstroms.

Of importance, the first and second unirradiated gaps have essentially identical lengths (in the direction of lengths L1 and L2). However, length L2 is 50 angstroms smaller than length L1. This can be achieved by irradiating photoresist 124 with a longer exposure time than photoresist 114 since, under appropriate conditions, a linear relationship exists between exposure time and photoresist linewidth change. See, for instance, SILICON PROCESSING FOR THE VLSI ERA, Volume 1: Process Technology, by S. Wolf and R. N. Tauber, published by Lattice Press, Sunset Beach, Calif., p. 437 (1986). During irradiation, the linewidths of photoresist 114 and 124 decrease at about 10 angstroms per millijoule/ $cm^2$. Therefore, irradiating photoresist 124 with a longer exposure time than photoresist 114 provides photoresist 114 with a linewidth (length L1) that is longer than the linewidth (length L2) of photoresist 124. Moreover, the exposure times for photoresists 114 and 124 can be adjusted to compensate for other factors, such as changes in intensity of the mercury-vapor lamp due to humidity, pressure or aging, that might otherwise affect the linewidths of photoresists 114 and 124.

Figure 1F:
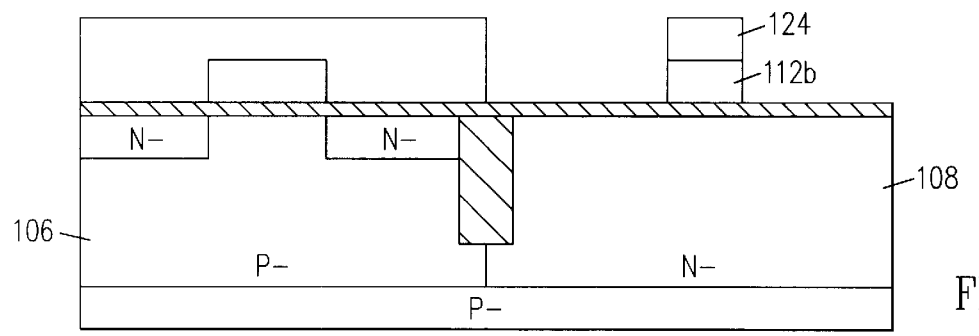

In Figure 1F, an anisotropic dry etch, similar to the previous dry etch, is applied that removes the regions of polysilicon 112 exposed by the openings in photoresist 124. After etching occurs, second gate 112b over PMOS region 108 has a length of 3450 angstroms, corresponding to length L2. It is noted that the ratio of the gate lengths, L1/L2, is selected to provide a desired drive current ratio between NMOS and PMOS devices.

Figure 1G:
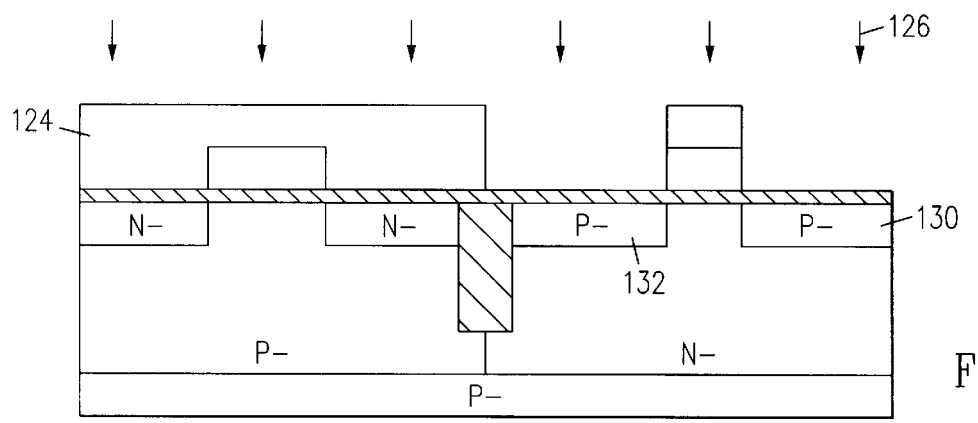

In FIG. 1G, lightly doped source and drain regions are implanted into PMOS region 108 by subjecting the structure to ion implantation of boron, indicated by arrows 126, at a dose in the range of $1 \times 10^{13}$ to $5 \times 10^{14}$ atoms/$cm^2$ and an energy in the range of 2 to 80 kiloelectron-volts. Photoresist 124 provides an implant mask that allows passage of boron through the openings therein. As a result, lightly doped source/drain regions 130 and 132 are implanted in PMOS region 108 and are self-aligned to the edges of second gate 112b. Lightly doped source/drain regions 130 and 132 are doped P− with a boron concentration in the range of about $1 \times 10^{17}$ to $1 \times 10^{18}$ atoms/$cm^3$ and a junction depth in the range of 100 to 1500 angstroms.

Figure 1H:
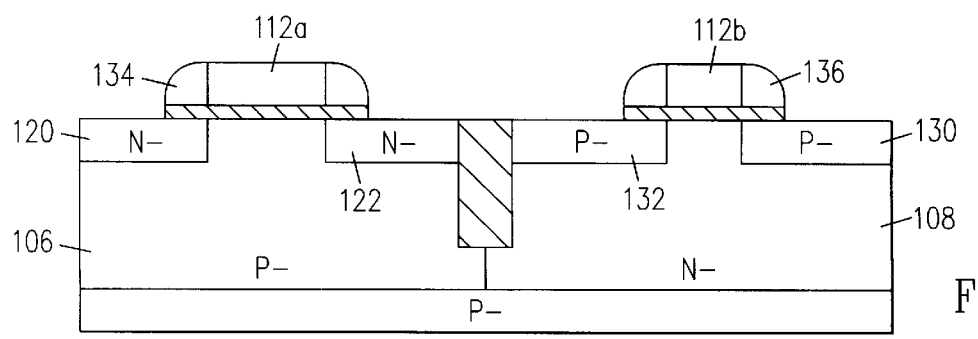

In FIG. 1H, photoresist 124 is stripped, and a layer of oxide with a thickness of 2500 angstroms is conformally deposited over the exposed surfaces by plasma enhanced CVD at a temperature in the range of 300° to 450° C. Thereafter, the structure is subjected to a reactive ion etch (RIE) that forms sidewall spacers 134 over NMOS region 106 and adjacent to the opposing edges of first gate 112a, and sidewall spacers 136 over PMOS region 108 and adjacent to the opposing edges of second gate 112b. Spacers 134 cover portions of lightly doped source/drain regions 120 and 122 adjacent to first gate 112a, and spacers 136 cover portions of lightly doped source/drain regions 130 and 132 adjacent to second gate 112b. The RIE also removes the regions of gate oxide 110 outside gates 112a and 112b and spacers 134 and 136.

Figure 1I:
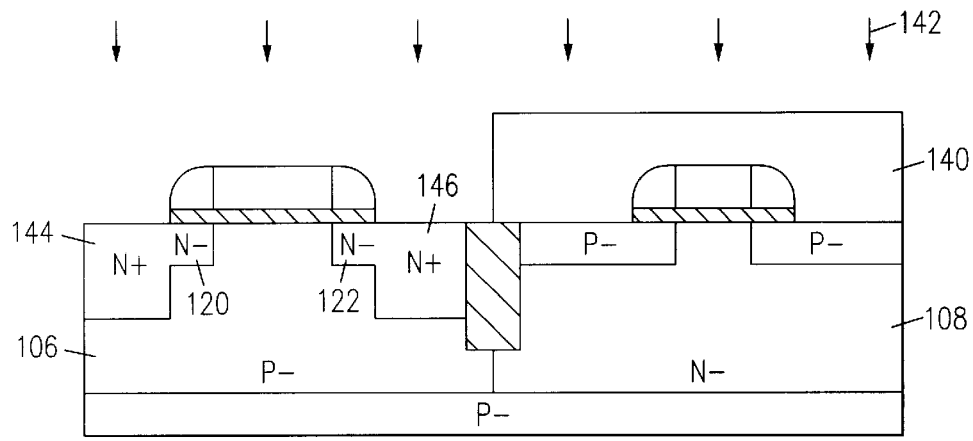

In FIG. 1I, photoresist 140 is deposited over NMOS region 106 and PMOS region 108. Photoresist 140 is patterned using the photolithographic system with a third reticle to obtain the desired image pattern. Thereafter, photoresist 140 is developed and the irradiated portions are removed so that photoresist 140 contains an opening that selectively exposes the entire NMOS region 106 while photoresist 140 covers the entire PMOS region 108. Heavily doped source and drain regions are then implanted into NMOS region 106 by subjecting the structure to ion implantation of arsenic, indicated by arrows 142, at a dose in the range of $1 \times 10^{15}$ to $5 \times 10^{15}$ atoms/$cm^2$ and an energy in the range of 2 to 80 kiloelectron-volts. Photoresist 140 provides an implant mask that allows passage of arsenic through the opening therein. Furthermore, first gate 112a and spacers 134 provide an implant mask for the underlying portions of NMOS region 106. As a result, heavily doped source/drain regions 144 and 146 are implanted in NMOS region 106 and are self-aligned to the outside edges of spacers 134. Heavily doped source/drain regions 144 and 146 are doped N+ with an arsenic concentration in the range of about $1 \times 10^{18}$ to $1 \times 10^{19}$ atoms/$cm^3$ and a junction depth in the range of 200 to 3000 angstroms. Preferably, the junction depth of heavily doped source/drain regions 144 and 146 exceeds that of lightly doped source/drain regions 120 and 122.

Figure 1J:
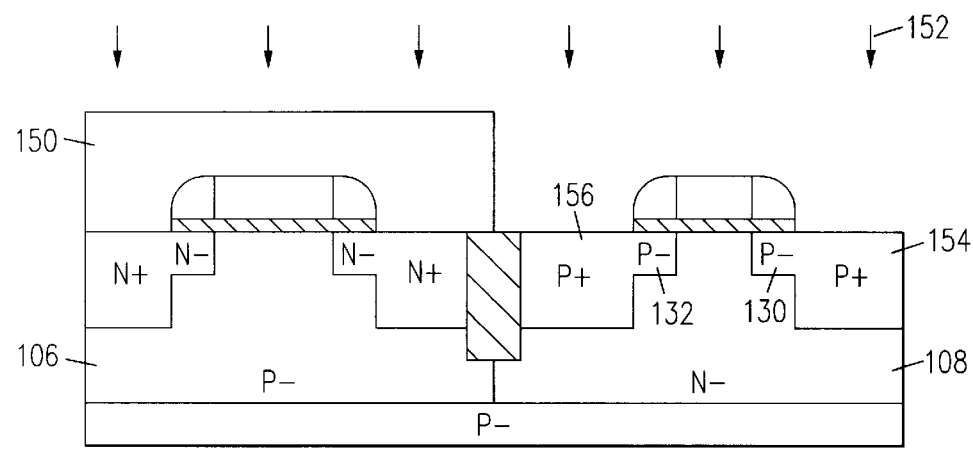

In FIG. 1J, photoresist 140 is stripped, and photoresist 150 is deposited over NMOS region 106 and PMOS region 108. Photoresist 150 is patterned using the photolithographic system with a fourth reticle to obtain the desired image pattern. Thereafter, photoresist 150 is developed and the irradiated portions are removed so that photoresist 150 contains an opening that selectively exposes the entire PMOS region 108 while photoresist 150 covers the entire NMOS region 106. Heavily doped source and drain regions are then implanted into PMOS region 108 by subjecting the structure to ion implantation of boron, indicated by arrows 152, at a dose in the range of $1 \times 10^{15}$ to $5 \times 10^{15}$ atoms/$cm^2$ and an energy in the range of 2 to 80 kiloelectron-volts. Photoresist 150 provides an implant mask that allows passage of boron through the opening therein. Furthermore, second gate 112b and spacers 136 provide an implant mask for the underlying portions of PMOS region 108. As a result, heavily doped source/drain regions 154 and 156 are implanted in PMOS region 108 and are self-aligned to the outside edges of spacers 136. Heavily doped source/drain regions 154 and 156 are doped P+ with a boron concentration in the range of about $1 \times 10^{18}$ to $1 \times 10^{19}$ to atoms/$cm^3$ and a junction depth in the range of 200 to 3000 angstroms. Preferably, the junction depth of heavily doped source/drain regions 154 and 156 exceeds that of lightly doped source/drain regions 130 and 132.

Figure 1K:
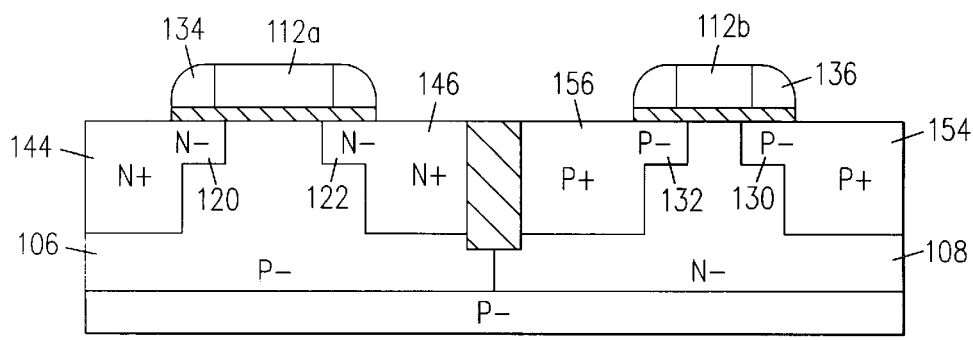

In FIG. 1K, photoresist 150 is stripped, and the device is annealed to remove crystalline damage and to drive-in and activate the implanted dopants using a rapid thermal anneal on the order of 950° to 1050° C. for 10 to 30 seconds. Regions 120 and 144 form a source and regions 122 and 146 form a drain for an NMOS device in NMOS region 106, and likewise, regions 130 and 154 form a source and regions 132 and 156 form a drain for a PMOS device in PMOS region 108. Since the dopants diffuse both vertically and laterally, heavily doped regions 144 and 146 extend partially beneath spacers 134, and heavily doped regions 154 and 156 extend partially beneath spacers 136. Similarly, lightly doped regions 120 and 122 extend slightly beneath first gate 112a, and lightly doped regions 130 and 132 extend slightly beneath second gate 112b.

For illustration purposes, the NMOS and PMOS devices provide a CMOS inverter circuit with gates 112a and 112b coupled together. Since gates 112a and 112b are formed in sequence using two separate masks, the potential exists for misalignment or displacement between the regions of the gates intended to contact one another. A sufficient misalignment or displacement may prevent the gates from electrically coupling to one another, thereby causing the CMOS inverter circuit to become defective. Various stitching techniques for coupling elements patterned by separate masks can be used.

Figure 2:
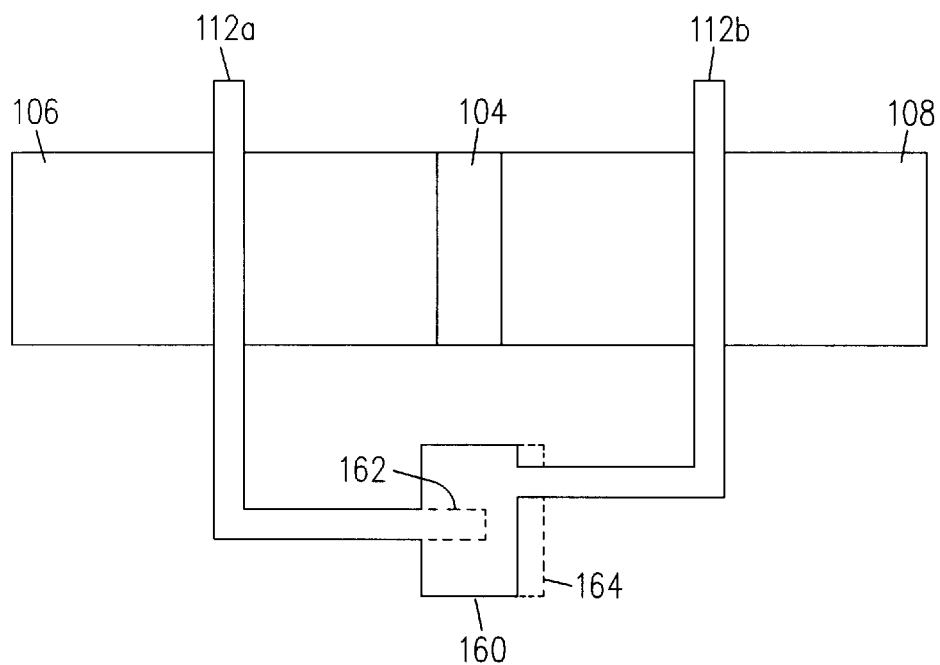
FIG. 2 shows a top plan view of a stitching technique for coupling the gates of the N-channel and P-channel devices.

FIG. 2 shows a top plan view of a stitching technique for electrically coupling gates 112a and 112b. Gates 112a and 112b are shown above NMOS region 106 and PMOS region 108, respectively, with trench oxide 104 therebetween. For convenience of explanation, the spacers are not shown. Gate 112a is adjacent to contact region 160. Broken lines 162 depict a distal end of gate 112a that would be formed in the absence of contact region 160. As is seen, gate 112b is misaligned both vertically and laterally with respect to gate 112a in the absence of contact region 160. However, contact region 160 compensates for this misalignment. Broken lines 164 depict a portion of contact region 160 that is present before gate 112b is formed. When polysilicon 112 is etched through the openings in photoresist 124 to form gate 112b, the portion of contact region 160 depicted by broken lines 164 is removed. Nonetheless, gate 112b is coupled by the remaining portion of contact region to gate 112a despite the misalignment. Further details regarding this stitching technique are disclosed in U.S. application Ser. No. 08/805,534, filed concurrently herewith, entitled "Method of Stitching Segments Defined by Adjacent Image Patterns During the Manufacture of a Semiconductor Device" by Fulford, Jr. et al., which is incorporated herein by reference.

Further processing steps in the fabrication of IGFETs typically include forming salicide contacts on the gates, sources and drains, forming a thick oxide layer over the active regions, forming contact windows in the oxide layer to expose the salicide contacts, forming interconnect metallization in the contact windows, and forming a passivation layer over the metallization. In addition, subsequent high-temperature process steps can be used to supplement or replace the anneal step to provide the desired anneal, activation, and drive-in functions. These further processing steps are conventional and need not be repeated herein. Likewise the principal processing steps disclosed herein may be combined with other steps apparent to those skilled in the art.

The present invention includes numerous variations to the embodiment described above. For instance, the gate can be various conductors, the gate insulator and spacers can be various dielectrics, and the NMOS and PMOS regions can be isolated using various techniques such as LOCOS oxidation. The gate material can be patterned to provide a conductive line above the isolation region. The lightly doped source/drain regions for the PMOS device can be implanted before implanting the lightly doped source/drain regions for the NMOS device, and similarly, the heavily doped source/drain regions for the PMOS device can be implanted before implanting the heavily doped source/drain regions for the NMOS device. The heavily doped source/drain regions for the NMOS device can be driven-in before implanting the heavily doped source/drain regions for the PMOS device, and vice-versa. Furthermore, the LDDs are not essential. Suitable N− type dopants include arsenic and phosphorus; suitable P− type dopants include boron $B_{10}$, boron $B_{11}$, and $BF_X$ species such as $BF_2$. The difference in gate lengths is preferably in the range of 20 to 500 angstroms, and more preferably in the range of 20 to 50 angstroms.

Furthermore, several approaches can be used to provide the NMOS and PMOS devices with different gate lengths. For instance, variations in the linewidths of the first and second photoresist layers (e.g., photoresist 114 and 124) can be due primarily to variations in radiation intensity, radiation exposure time, resist thickness, developer concentration, image patterns, or combinations thereof Likewise, different etches can be applied through openings in the first and second photoresist layers, resulting in different amounts of isotropic etching or undercutting of the gate material beneath the photoresist layers.

The invention is particularly well-suited for fabricating N-channel MOSFETs, P-channel MOSFETs and other types of IGFETs, particularly for high-performance microprocessors where high circuit density is essential. Although a single pair of N-channel and P-channel devices has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making N-channel and P-channel devices with different gate lengths, comprising the steps of:

providing a semiconductor substrate with first and second active regions;

forming a first gate over a portion of the first active region and a second gate over a portion of the second active region, wherein the first and second gates are formed in sequence and have different lengths, and forming the first and second gates includes (i) forming a gate material over the first and second active regions, (ii) selectively removing a first portion of the gate material over the first active region to form the first gates, and then (iii) selectively removing a second portion of the gate material over the second active region to form the second gate;

forming a source and drain in the first active region; and forming a source and drain in the second active region.

2. The method of claim 1, wherein:

selectively removing the first portion of the gate material includes depositing a first photoresist layer over the first and second active regions, patterning the first photoresist layer, and etching the first portion of the gate material through openings in the first photoresist layer; and selectively removing the second portion of the gate material includes depositing a second photoresist layer over the first and second active regions, patterning the second photoresist layer, and etching the second portion of the gate material through openings in the second photoresist layer.

3. The method of claim 2, wherein:

patterning the first photoresist layer includes selectively irradiating the first photoresist layer for a first exposure time;

patterning the second photoresist layer includes selectively irradiating the second photoresist layer for a second exposure time; and the first and second gates have the different lengths primarily due to a difference between the first and second exposure times.

4. The method of claim 3, wherein the first and second gates have different gate lengths as a result of the difference between the first and second exposure times.

5. The method of claim 2, wherein:
  patterning the first photoresist layer includes selectively irradiating the first photoresist layer with a first radiation intensity;
  patterning the second photoresist layer includes selectively irradiating the second photoresist layer with a second radiation intensity; and
  the first and second gates have different lengths primarily due to a difference between the first and second radiation intensities.

6. The method of claim 2, wherein:
  patterning the first photoresist layer includes selectively irradiating the first photoresist layer with a first image pattern;
  patterning the second photoresist layer includes selectively irradiating the second photoresist layer with a second image pattern; and
  the first and second gates have different lengths primarily due to a difference between the first and second image patterns.

7. The method of claim 2, wherein:
  etching the first portion of the gate material includes applying a first etch;
  etching the second portion of the gate material includes applying a second etch; and
  the first and second gates have different lengths primarily due to a difference between the first and second etches.

8. The method of claim 2, wherein forming the sources and drains includes:
  implanting a dopant of first conductivity type into the first active region through the openings in the first photoresist layer; and
  implanting a dopant of second conductivity type into the second active region through the openings in the second photoresist layer.

9. The method of claim 8, wherein the gate material is polysilicon.

10. The method of claim 1, wherein forming the sources and drains includes:
  implanting a light dose of a dopant of first conductivity type into the first active region using afirst photoresist layer that defines the first gate as an implant mask;
  implanting a light dose of a dopant of second conductivity type into the second active region using a second photoresist layer that defines the second gate as an implant mask;
  forming first spacers adjacent to the first gate and second spacers adjacent to the second gate after stripping the first and second photoresist layers;
  implanting a heavy dose of a dopant of first conductivity type into the first active region using the first gate and the first spacers as an implant mask; and
  implanting a heavy dose of a dopant of second conductivity type into the second active region using the second gate and the second spacers as an implant mask.

11. The method of claim 10, wherein the first and second gates are polysilicon, implanting the heavy dose of the dopant of first conductivity type dopes the first gate, and implanting the heavy dose of the dopant of second conductivity type dopes the second gate.

12. The method of claim 1, wherein the difference in lengths between the first and second gates is in the range of 20 to 500 angstroms.

13. The method of claim 1, wherein the difference in lengths between the first and second gates affects a drive current ratio between the N-channel and P-channel devices.

14. The method of claim 13, wherein the N-channel and P-channel devices are adjacent to an isolation region in the substrate.

15. A method of making N-channel and P-channel devices with different gate lengths, comprising the steps of:
  providing a semiconductor substrate with first and second active regions adjacent to an isolation region;
  forming a gate insulator on the first and second active regions;
  forming a gate material on the gate insulator;
  forming a first photoresist layer over the gate material;
  etching a first portion of the gate material defined by openings in the first photoresist layer to form a first gate over the first active region;
  removing the first photoresist layer;
  forming a second photoresist layer over the gate material after removing the first photoresist layer;
  etching a second portion of the gate material defined by openings in the second photoresist layer to form a second gate over the second active region, wherein the first and second gates have different lengths;
  removing the second photoresist layer;
  forming a source and drain in the first active region; and
  forming a source and drain in the second active region.

16. The method of claim 15, wherein:
  forming the first photoresist layer includes selectively irradiating the first photoresist layer with a first image pattern having a first configuration for a first exposure time;
  forming the second photoresist layer includes selectively irradiating the second photoresist layer with a second image pattern having a second configuration for a second exposure time; and
  the first and second gates have different lengths primarily due to a difference between the first and second exposure times.

17. The method of claim 16, wherein the first and second gates have different gate lengths due to the difference between the first and second exposure times.

18. The method of claim 16, wherein:
  selectively irradiating the first photoresist layer during the first exposure time decreases a linewidth of the first photoresist layer that defines the first gate at a rate of about 10 angstroms per millijoule/cm$^2$; and
  selectively irradiating the second photoresist layer during the second exposure time decreases a linewidth of the second photoresist layer that defines the second gate at a rate of about 10 angstroms per millijoule/cm$^2$.

19. The method of claim 15, wherein forming the sources and drains includes:
  implanting a light dose of a dopant of first conductivity type through the openings in the first photoresist layer into the first active region outside the first gate;
  implanting a light dose of a dopant of second conductivity type through the openings in the second photoresist layer into the second active region outside the second gate;
  forming first spacers adjacent to the first gate and second spacers adjacent to the second gate;
  forming a third photoresist layer over the second active region with an opening above the first active region;
  implanting a heavy dose of a dopant of first conductivity type through the opening in the third photoresist layer into the first active region using the first gate and the first spacers as an implant mask;

removing the third photoresist layer;

forming a fourth photoresist layer over the first active region with an opening above the second active region;

implanting a heavy dose of a dopant of second conductivity type through the opening in the fourth photoresist layer into the second active region using the second gate and the second spacers as an implant mask; and removing the fourth photoresist layer.

20. The method of claim 19, wherein the heavy dose of the dopant of first conductivity type dopes the first gate, and the heavy dose of the dopant of second conductivity type dopes the second gate.

21. The method of claim 19, wherein the gate material is polysilicon.

22. The method of claim 19, wherein the spacers are silicon dioxide.

23. The method of claim 15, wherein the N-channel and P-channel devices are adjacent to an isolation region in the substrate.

24. The method of claim 15, wherein the first and second gates are electrically coupled to one another, and the N-channel and P-channel devices provide an inverter circuit.

25. The method of claim 15, wherein the difference in lengths between the first and second gates is in the range of 20 to 500 angstroms.

26. The method of claim 15, wherein the difference in lengths between the first and second gates is in the range of 20 to 50 angstroms.

27. The method of claim 15, wherein the difference in lengths between the first and second gates affects a drive current ratio between the N-channel and P-channel devices.

28. The method of claim 15, including using the N-channel and P-channel devices in an integrated circuit chip.

29. The method of claim 15, including using the N-channel and P-channel devices in an electronic system including a microprocessor, a memory and a system bus.

30. A method of making NMOS and PMOS devices with different gate lengths, comprising the steps of:

providing a semiconductor substrate with NMOS and PMOS regions extending to a top surface of the substrate and adjacent to an isolation region in the substrate;

forming a gate oxide on the NMOS and PMOS regions;

forming a polysilicon layer on the gate oxide;

forming a first photoresist layer over the polysilicon layer;

etching a first portion of the polysilicon layer defined by openings in the first photoresist layer to form a first gate over one of the NMOS and PMOS regions;

stripping the first photoresist layer;

forming a second photoresist layer over the polysilicon layer after stripping the first photoresist layer;

etching a second portion of the polysilicon layer defined by openings in the second photoresist layer to form a second gate over one of the NMOS and PMOS regions not underlying the first gate, wherein the first and second gates are electrically coupled to one another and have different lengths;

implanting an N-type dopant into the NMOS region in conjunction with forming a source and drain for the NMOS device; and implanting a P-type dopant into the PMOS region in conjunction with forming a source and drain for the PMOS device.

31. The method of claim 30, wherein:

forming the first photoresist layer includes selectively irradiating the first photoresist layer with a first image pattern for a first exposure time;

forming the second photoresist layer includes selectively irradiating the second photoresist layer with a second image pattern for a second exposure time; and a difference between the first and second exposure times results in the different lengths of the first and second gates.

32. The method of claim 31, wherein:

the first image pattern defines a first unirradiated gap over the NMOS region;

the second image pattern defines a second unirradiated gap over the PMOS regions; and the unirradiated gaps have essentially identical lengths in a direction of the gate lengths.

33. The method of claim 31, wherein the first and second image patterns have different configurations.

34. A method of making N-channel and P-channel devices with different gate lengths, comprising the steps of:

providing a semiconductor substrate with first and second active regions;

forming a first gate over a portion of the first active region and a second gate over a portion of the second active region, wherein the first and second gates are formed in sequence and have different lengths;

forming a source and drain in the first active region; and forming a source and drain in the second active region;

wherein forming the sources and drains includes:

implanting a light dose of a dopant of first conductivity type into the first active region using a first photoresist layer that defines the first gate as an implant mask;

implanting a light dose of a dopant of second conductivity type into the second active region using a second photoresist layer that defines the second gate as an implant mask;

forming first spacers adjacent to the first gate and second spacers adjacent to the second gate after stripping the first and second photoresist layers;

implanting a heavy dose of a dopant of first conductivity type into the first active region using the first gate and the first spacers as an implant mask; and implanting a heavy dose of a dopant of second conductivity type into the second active region using the second gate and the second spacers as an implant mask.

* * * * *